(12) United States Patent
Tsang

(10) Patent No.: US 6,982,445 B2
(45) Date of Patent: Jan. 3, 2006

(54) MRAM ARCHITECTURE WITH A BIT LINE LOCATED UNDERNEATH THE MAGNETIC TUNNELING JUNCTION DEVICE

(75) Inventor: David Tsang, Cupertino, CA (US)

(73) Assignee: Applied Spintronics Technology, Inc., Cupertino, CA (US)

( * ) Notice: Subject to any disclaimer, the term of this patent is extended or adjusted under 35 U.S.C. 154(b) by 14 days.

(21) Appl. No.: 10/688,250

(22) Filed: Oct. 16, 2003

(65) Prior Publication Data

US 2004/0222450 A1 Nov. 11, 2004

Related U.S. Application Data

(60) Provisional application No. 60/467,529, filed on May 5, 2003.

(51) Int. Cl.
*H01L 29/76* (2006.01)
(52) U.S. Cl. ...................... 257/295; 257/422
(58) Field of Classification Search ............. 257/295, 257/296, 421, 422, 659; 365/220, 171
See application file for complete search history.

(56) References Cited

U.S. PATENT DOCUMENTS

| | | | |
|---|---|---|---|
| 6,211,090 B1 * | 4/2001 | Durlam et al. | 438/692 |
| 6,430,084 B1 * | 8/2002 | Rizzo et al. | 365/173 |
| 6,538,920 B2 * | 3/2003 | Sharma et al. | 365/171 |
| 6,740,947 B1 * | 5/2004 | Bhattacharyya et al. | 257/421 |
| 6,788,605 B2 * | 9/2004 | Sharma et al. | 365/220 |
| 2004/0191928 A1 * | 9/2004 | Shi | 438/3 |

* cited by examiner

*Primary Examiner*—David Nelms
*Assistant Examiner*—Thinh T Nguyen
(74) *Attorney, Agent, or Firm*—Sawyer Law Group LLP

(57) ABSTRACT

A method and system for providing and using a magnetic memory are disclosed. The method and system include providing a plurality of magnetic memory cells, at least a first write line, and at least a second write line. Each of the magnetic memory cells includes a magnetic element having a top and a bottom. The first write line(s) are connected to the bottom of magnetic element of the first portion of the plurality of magnetic memory cells. The second write line(s) reside above the top of the magnetic element of each of a second portion of the magnetic memory cells. The second write line(s) are electrically insulated from the magnetic element of each of the second portion of the plurality of magnetic memory cells.

13 Claims, 12 Drawing Sheets

MRAM ARCHITECTURE WITH A BIT LINE LOCATED UNDERNEATH THE MAGNETIC TUNNELING JUNCTION DEVICE

CROSS-REFERENCE TO RELATED APPLICATIONS

The present application is related to U.S. patent application Ser. No. 10/459,133 entitled "MRAM MEMORIES UTILIZING MAGNETIC WRITE LINES", filed on Jun. 11, 2003, which claims benefit of provisional application No. 60/431,742 filed on Dec. 9, 2002, and assigned to the assignee of the present application. The present application is related to U.S. patent application Ser. No. 10/606,612 entitled "HIGH DENSITY AND HIGH PROGRAMMING EFFICIENCY MRAM DESIGN", filed on Jun. 26, 2003, and assigned to the assignee of the present application.

FIELD OF THE INVENTION

The present invention pertains to magnetic memories, and more particularly to a method and system for providing a magnetic random access memory (MRAM) that improved programming efficiency as well as a simpler fabrication process.

BACKGROUND OF THE INVENTION

Recently, a renewed interest in thin-film magnetic random access memories (MRAM) has been sparked by the potential application of MRAM to both nonvolatile and volatile memories. FIG. 1A depicts a portion of a conventional MRAM 1. The portion of the conventional MRAM 1 depicted is at the intersection of two interconnects 20 and 22. Interconnect 20, which is located beneath and isolated from the MTJ stack 10, is commonly referred to as the write word line, and line 22, which is located above and connected to the MTJ device, is commonly referred to as the bit line.

The conventional MRAM 1 includes a number of conventional magnetic elements, one of which is depicted in FIG. 1A. The conventional magnetic element depicted in FIG. 1A is an MTJ stack 30. The MTJ stack 30 thus serves as at least part of a magnetic memory cell. The MRAM 1 also includes an isolation transistor 10 having a source 13, a drain 14, and a gate 16. The source 13 is connected to a ground line 17 via a conductive plug 15. The drain 14 is coupled with the MTJ stack 30 through the use of a conductive stud 18 and a bottom electrode 19. In such a conventional MRAM 1, the memory cells are programmed by magnetic fields induced by current carried in the lines 20 and 22, which are typically copper lines or aluminum lines. Typically, two orthogonal interconnects 20 and 22 are employed. One interconnect, the conventional bit line 22, is positioned above the MTJ stack 30. The second interconnect, the conventional write word line 20, is positioned below the MTJ stack 30.

The MTJ stack 30 is located at the intersection of the conventional bit line 22 and the conventional write word line 20. The MTJ stack 30 primarily includes a free layer 38 having a changeable magnetic vector (not explicitly shown), a pinned layer 34 having a fixed magnetic vector (not explicitly shown), and an insulator 36 in between the two magnetic layers 34 and 38. The MTJ stack 30 also typically includes layers 32 that include seed layers and an antiferromagnetic layer that is strongly coupled to the pinned layer 34.

During writing, a first current in the conventional bit line 22 and a second current in the conventional write word line 20 yield two magnetic fields on the free layer 38. In response to these external magnetic fields, the magnetic vector in the free layer 38 orients in a direction that depends on the direction and amplitude of the currents in the conventional bit line 22 and the conventional write word line 20. In general, the direction of the current in the conventional bit line 22 for writing a zero (0) differs from the direction of current in the conventional bit line 22 for writing a one (1). During reading, the transistor 10 is turned on so that a small tunneling current flows from the conventional bit line 22 through the MTJ stack 30 and the isolation transistor 10 to the ground line 17. The amount of current flowing through MTJ stack 30 or the voltage drop across MTJ stack 30 can be measured to determine the state of the memory cell. In some designs, the isolation transistor 10 is replaced by a diode or completely omitted, so that the MTJ stack 30 is in direct contact with conventional write word line 20.

FIG. 1B depicts a high-level flow chart of a conventional method 50 for providing a conventional MRAM, such as the conventional MRAM 1. The method 50 is thus discussed in conjunction with the conventional MRAM 1 depicted in FIG. 1A. Referring to FIGS. 1A and 1B, the isolation transistor 10 is first fabricated, via step 52. The ground line 17, the conventional write word line 20, and the stud 18 are formed, via step 54. Step 54, of forming the ground line 17, the conventional write word line 20, and the stud 18 typically includes multiple sub-steps. The last sub-step of forming the conventional write word line 20 and the stud 18 involves a chemical mechanical polishing (CMP) process to obtain a smooth and flat surface. Once formation of the structures 17, 18, and 20 is completed, a thin dielectric layer is deposited to insulate the conventional write word line 20 from the bottom electrode 19 (which is not formed yet), via step 56. A via is opened to expose the top surface of the stud 18, via step 58. The bottom electrode 19 and the MTJ stack 30 are deposited, via step 60. Thus, the MTJ stack is in electrical contact with the stud 18 through the bottom electrode 19. A photolithography process and an etching process are then carried out to define the dimension of bottom electrode 19, via step 62. Another photolithography and etching process follows to define the dimension of MTJ stack 30, via step 64. The conventional bit line 22 is then formed after any exposed portion of the bottom electrode 19 has been covered by an insulator, via step 66. The conventional bit line 22 is so formed to ensure that the conventional bit line 22 is electrically connected to the stud 18 through the MTJ stack 30. Thus, the conventional MRAM 1 is formed.

FIG. 2 depicts another conventional MRAM 1'. Portions of the MRAM 1' are analogous to the MRAM 1 and are thus labeled similarly. For clarity, only the MTJ stack 30, the conventional bit line 22' and the conventional word line 20' are depicted. The conventional bit line 22' includes a nonmagnetic portion 25 and magnetic cladding 27. Similarly, the conventional word line 20' includes a nonmagnetic portion 21 and magnetic cladding 23. The magnetic cladding 23 and 27 are soft magnetic materials, reside on surfaces not facing the MTJ stack 30, and are used to concentrate the magnetic flux associated with the current provided through the conventional word line 20' and the conventional bit line 22'. Thus, the soft magnetic cladding 23 and 27 concentrate the flux on the MTJ stack 30, making the free layer 38 easier to program. However, one of ordinary skill in the art will readily recognize that the magnetic properties of the portions of the magnetic cladding 23 and 27 on the vertical sidewalls of the conventional lines 20' and 22', respectively, are hard to control.

Although the method 50 and conventional MRAMs 1 and 1' function, one of ordinary skill in the art will readily recognize that the method 50 can lead to a number of faults in the conventional MRAMs 1 and 1'. One of ordinary skill in the art will readily recognize that photolithography process used in defining the MTJ stack 30 in step 64 is carried out on a surface having a complicated topography. In particular, the surface on which the MTJ stack is formed includes a via (not explicitly shown) on top of the stud 18 and a multilayer stack of layers 32, 34, 36, and 38 in the MTJ 30 that resides on the bottom electrode 19. Furthermore, one of ordinary skill in the art will readily recognize that the bottom electrode 19 has a shape that is not flat. One of ordinary skill in the art will, therefore, readily recognize that critical dimension control is very difficult for a photolithography process preformed on a surface that is not flat. As a result, the dimensions of the MTJ stack 30 could vary from place to place along the stack 30 and between different MTJ stacks (not shown). As a result, a significant variation in magnetic performance between magnetic memory cells in the MRAM 1 or 1' occurs.

Accordingly, what is needed is a method and system for reducing the variation in magnetic performance between magnetic memory cells in the MRAM 1 or 1'.

SUMMARY OF THE INVENTION

The present invention provides a method and system for providing and using a magnetic memory. The method and system comprise providing a plurality of magnetic elements, at least a first write line, and at least a second write line. Each of the magnetic elements has a top and a bottom. The first write line(s) are connected to the bottom of magnetic element of a first portion of the plurality of magnetic elements. The second write line(s) reside above the top of a second portion of the magnetic elements. The second write line(s) are electrically insulated from the each of the second portion of the magnetic elements.

According to the system and method disclosed herein, the present invention provides a magnetic memory architecture allowing for simpler, more controlled, and more flexible processing. Furthermore, the variation in magnetic properties of the magnetic memories can be decreased and performance of the magnetic memories improved.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 3:
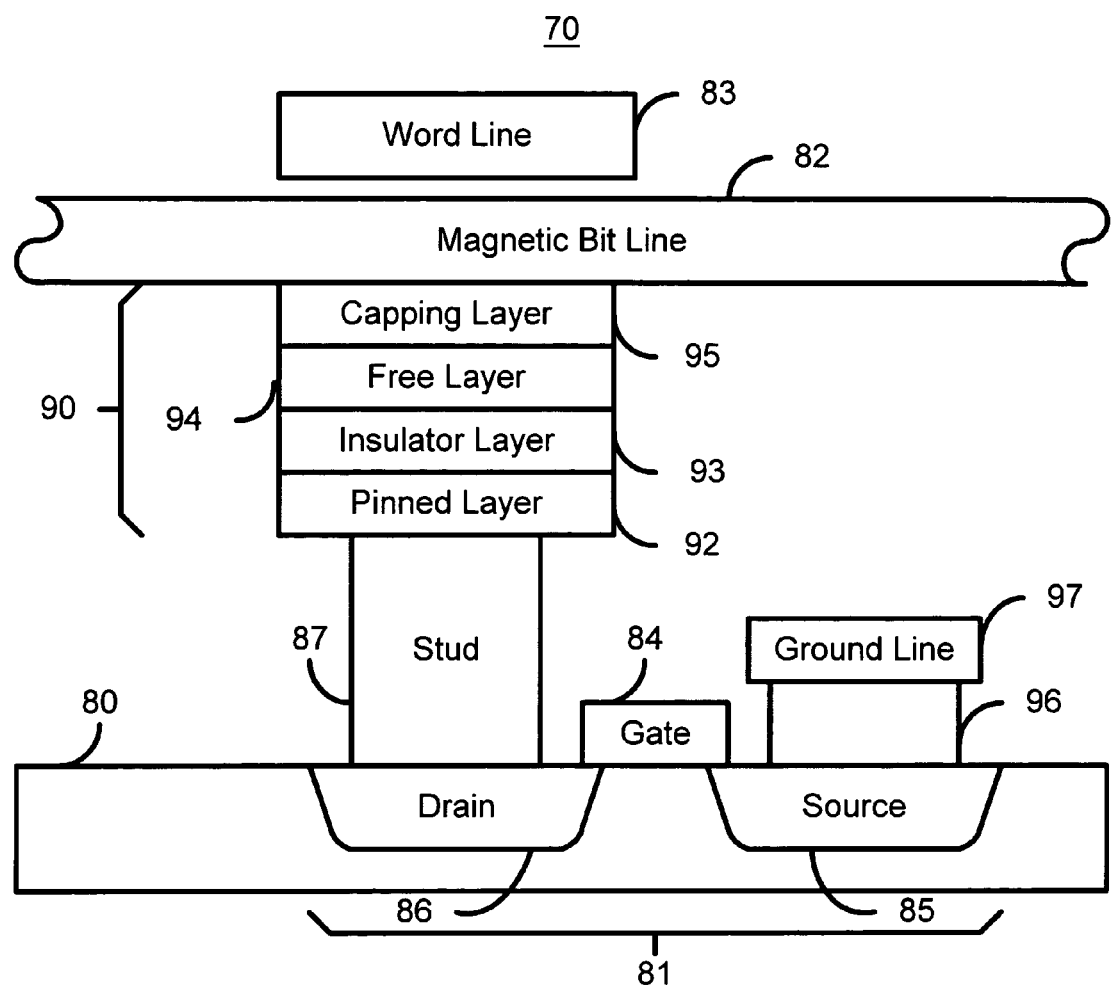
FIG. 3 depicts a cross-section of one embodiment of an MRAM including magnetic write line(s).

Co-pending U.S. patent application Serial No. 60/431/742 entitled "MRAM MEMORIES UTILIZING MAGNETIC WRITE LINES" assigned to the assignee of the present application describes a MRAM architecture that addresses many of the issues encountered in conventional MRAM devices. Applicant hereby incorporates by reference the above-identified co-pending application. FIG. 3 depicts one embodiment of a portion of an MRAM 70 including the basic structure described in the above-identified co-pending application. The MRAM 70 depicted in FIG. 3 includes a magnetic element 90, which is preferably a MTJ stack 90, a selection device 81 formed in a substrate 80, a magnetic write line 83, a bit line 82, a conductive stud 87, connecting stud 96 and ground line 97. The selection device 81 is preferably a FET transistor including gate 84, source 85 and drain 86. The MTJ stack also includes the pinned layer 92 having a fixed magnetic vector (not shown), a tunneling layer 93, a free layer 94 having a changeable magnetic vector (not shown), and a conductive capping layer 95. The conductive capping layer 95 is preferably a nonmagnetic spacer layer 95. The MTJ stack includes layers (not explicitly shown) that includes seed and, preferably, antiferromagnetic layers.

The magnetic write line 82 includes soft magnetic materials and is separated from the free layer 94 of the MTJ stack 90 by the non-magnetic spacer layer 95. In one embodiment, the write line 83 is also magnetic. The magnetic write line 82 is preferably substantially or completely composed of a soft magnetic material. In addition, at least a core, as opposed to a cladding layer, includes the soft magnetic layer. In an alternate embodiment, the magnetic write line 82 may be a laminate including one or more layers of magnetic material alternating with one or more layers of nonmagnetic material. Further, the magnetic write line 82 may be magnetic or may have a nonmagnetic layer separated from a soft magnetic layer (not shown) by an insulating layer (not shown). Due to the small spacing between the magnetic write line 82 and the free layer 94, the magnetic vector of free layer 94 is strongly coupled magnetostatically to the magnetic vector of the magnetic write line 82. Such a magnetostatic coupling promotes rotation amplitude for the free layer magnetic vector. Hence, write efficiency is improved. In addition, the write line 83 may also be magnetic in the manner described above with respect to the magnetic write line 82.

Although the MRAM architecture described in the above-identified co-pending application functions well for its intended purpose, one of ordinary skill in the art will readily recognize fabrication may also be relatively complex because the topography underlying the MTJ stack 90 may be complex.

The present invention provides a method and system for providing and using a magnetic memory. The method and system comprise providing a plurality of magnetic elements, at least a first write line, and at least a second write line. Each of the magnetic elements has a top and a bottom. The first write line(s) are connected to the bottom of magnetic element of a first portion of the plurality of magnetic elements. The second write line(s) reside above the top of a second portion of the magnetic elements. The second write line(s) are electrically insulated from the each of the second portion of the magnetic elements.

The present invention will be described in terms of particular types of magnetic memory cells, particular materials, and a particular configuration of elements. Instead, the present invention is more generally applicable to magnetic devices for which it is desirable to reduce magnetostatic stray field and improve magnetic stability. For example, one of ordinary skill in the art will readily recognize that this method and system will operate effectively for other magnetic memories, other magnetic memory cells, and other materials and configurations non inconsistent with the present invention. Furthermore, the present invention is described in the context of particular devices, such as (MTJ) stacks and metal-oxide semiconductor (MOS) devices, and MRAM architectures. However, one of ordinary skill in the art will readily recognize that the present invention is not limited to such devices and architectures. Thus, the method and system in accordance with the present invention are more generally applicable to magnetic devices for which simpler fabrication and/or improved performance. Furthermore, the present invention is described in the context of a simple, nonmagnetic write line. However, one of ordinary skill in the art will readily recognize that the method and system can be used in conjunction with a segmented write line and/or a write line having other properties not inconsistent with the present invention. Further, the present invention is described in the context of word lines and bit line that have particular locations and orientations. One of ordinary skill in the art will, however, readily recognize that these names are for clarity of discussion only. Consequently, the names can be exchanged or replaced by other terms for analogous structures without affecting the operation of the present invention. The present invention is also described in the context of methods having certain steps performed in a particular order. However, one of ordinary skill in the art will readily recognize that other and/or additional steps and/or a different order not inconsistent with the present invention can be used.

Figure 4A:
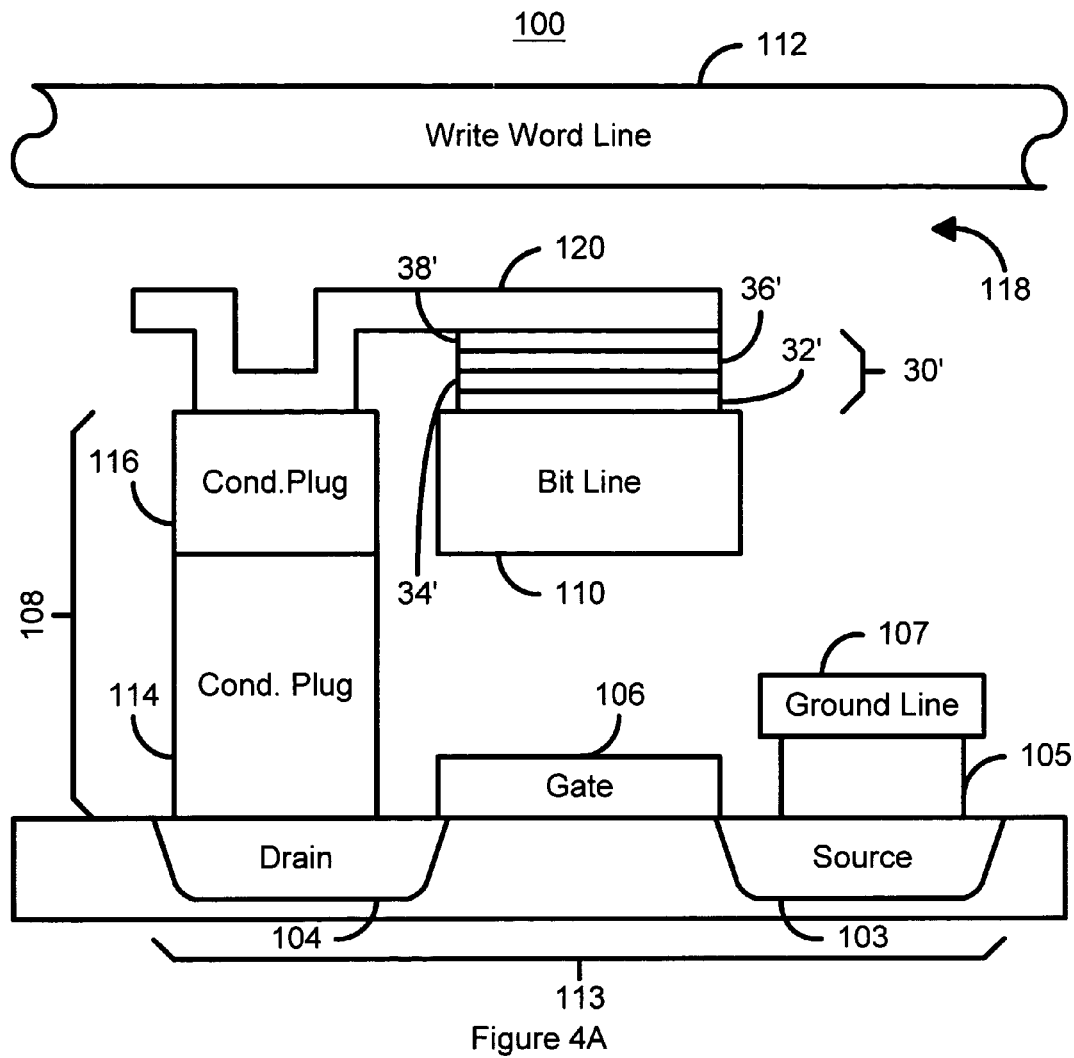
FIG. 4A depicts one embodiment of an MRAM architecture in accordance with the present invention including bit lines that resides below the magnetic elements.

FIG. 4A depicts one embodiment of an MRAM architecture 100 in accordance with the present invention including bit lines that resides below the magnetic elements. For clarity, only a single magnetic element, a single bit line, and a single write word line are shown. However, one of ordinary skill in the art will readily recognize that the MRAM 100 includes a number of magnetic elements and write lines. For clarity, the write lines are termed herein bit lines and word lines. The MRAM 100 depicted includes a magnetic element that is preferably a MTJ stack 30'. The MTJ stack 30' is preferably analogous to the MTJ stack 30 depicted in FIG. 1A, and is thus labeled in a similar manner. Referring back to FIG. 4A, the MRAM 100 includes a bit line 110 having a long axis that is preferably perpendicular to the paper, as shown in FIG. 4A. The MRAM 100 also includes a write word line 112, the MTJ stack 30', and an isolation transistor 113. Also included in the MRAM 100 are a conductive stud 108, a thin film conductor 120, and a ground line 107.

The MTJ stack 30' includes at least a pinned layer 34' having a fixed magnetic vector (not shown), a free layer 38' having a changeable magnetic vector (not shown), and a dielectric layer 36' between the pinned layer 34' and the free layer 38'. In a preferred embodiment, the MTJ stack 30' also includes additional layers 32', which may include a layer of antiferromagnetic material in contact with the surface of the pinned layer 34' to fix the direction of the magnetization in the pinned layer 34' and seed layers. Note that although the layers 32', 34', 36', and 38' are depicted in a particular order, with the free layer 38' being at the top of the MTJ stack 30', nothing prevents the layers 32', 34', 36', and 38' from being in a different order. In particular, nothing prevents the free layer 38' from residing below the insulating layer 36' and the pinned layer 34' from residing above the insulating layer 36'. In the embodiment of the MRAM 100 shown, the easy axis of the free layer 38' is preferably along the symmetrical axis of the write word line 112. In particular, the easy axis is preferably substantially perpendicular to the lengthwise direction of the bit line 110.

The bit line 110 resides under the MTJ stack 30' and is electrically connected to the bottom of the MTJ stack 30'. Thus, the bit line 110 still can be used to provide a read current to the MTJ stack 30'. The write word line 112 is above the MTJ stack 30'. In addition, the write word line 112 is electrically isolated from the MTJ stack 30' by a layer of insulating material 118.

Figure 2:
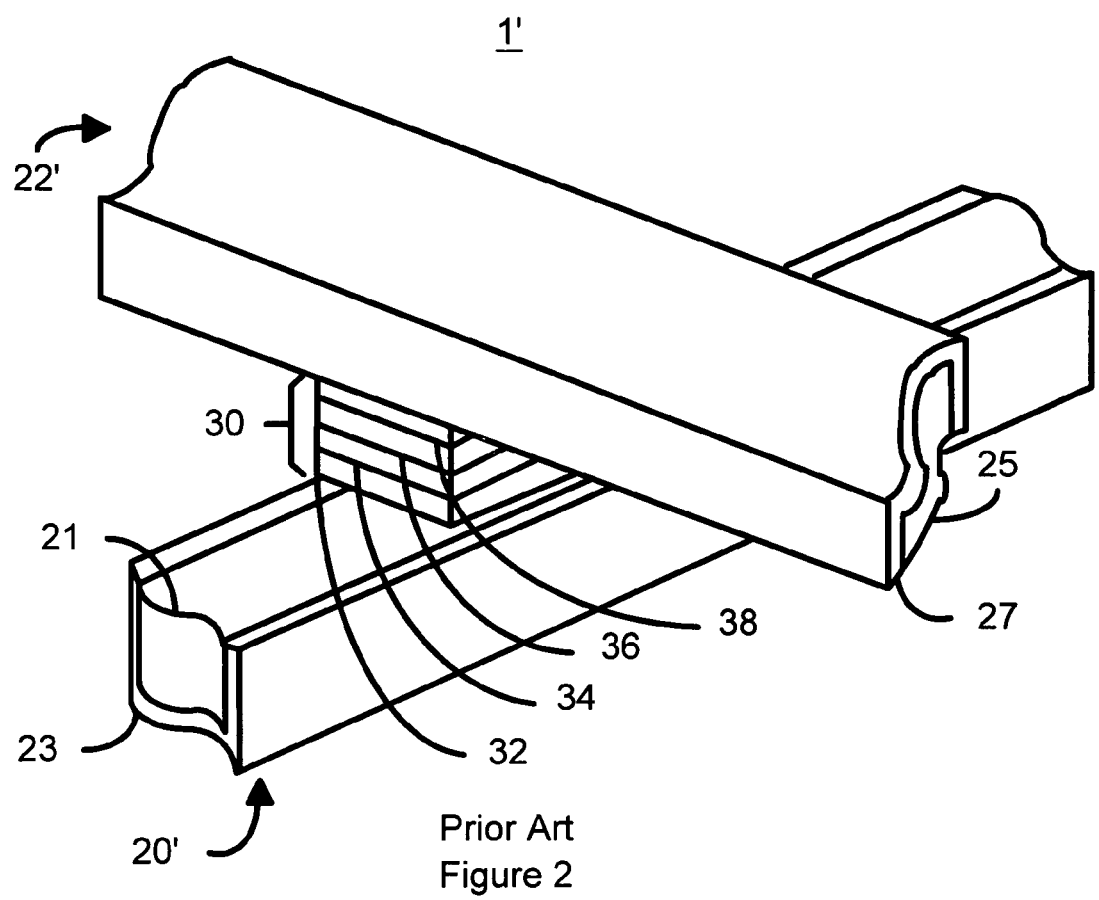
FIG. 2 is a cross-section of another conventional MRAM utilizing MTJ stacks in memory cells, conventional bit lines, and conventional word lines.

In one embodiment, the bit line 110, as well as the write word line 112, are nonmagnetic. However, in alternate embodiments, one or both of the bit line 110 and the write word line 112 could be magnetic. For example, the bit line 110 and/or the write word line 112 may include cladding as described in conjunction with FIG. 2, or may be soft magnetic write lines as described in the above-identified co-pending application and FIG. 3. The bit line 110 and/or the write word line 112 may also have a soft magnetic cladding layer that is electrically insulated from the bit line 110 and/or the write word line 112, respectively. In one such embodiment, the bit line 110 is magnetostatically coupled with the free layer 38' of the MTJ stack 30'. Furthermore, if the bit line 110 is a soft magnetic material, the bit line 110 could act as the pinned layer for the MTJ stack 30'. In such an embodiment, the pinned layer 34' may be omitted from the MTJ stack 30' and the layer(s) 32' be placed below the bit line 110. Furthermore, if the bit line 110 is not to be used as the pinned layer for the MTJ stack 30', then the bit line 110 is preferably separated from the MTJ stack 30' by a nonmagnetic, conductive layer.

The isolation transistor 113 includes a source 103, a drain 104 and a gate 106. The isolation transistor 113 is connected with the MTJ stack 30' through the conductive stud 108 and a thin film conductor 120. As can be seen in FIG. 4A, the thin film conductor 120 is connected to the MTJ stack 30' at the top of the MTJ stack 30'. The conductive stud 108 is electrically connected to the drain 104 of the isolation transistor. The conductive stud 108 is shown as include two portions 114 and 116, which are preferably fabricated in separate steps as described below. The source 103 of the isolation transistor 113 is coupled with a ground line 107 through a conductive plug 105.

Figure 1A:
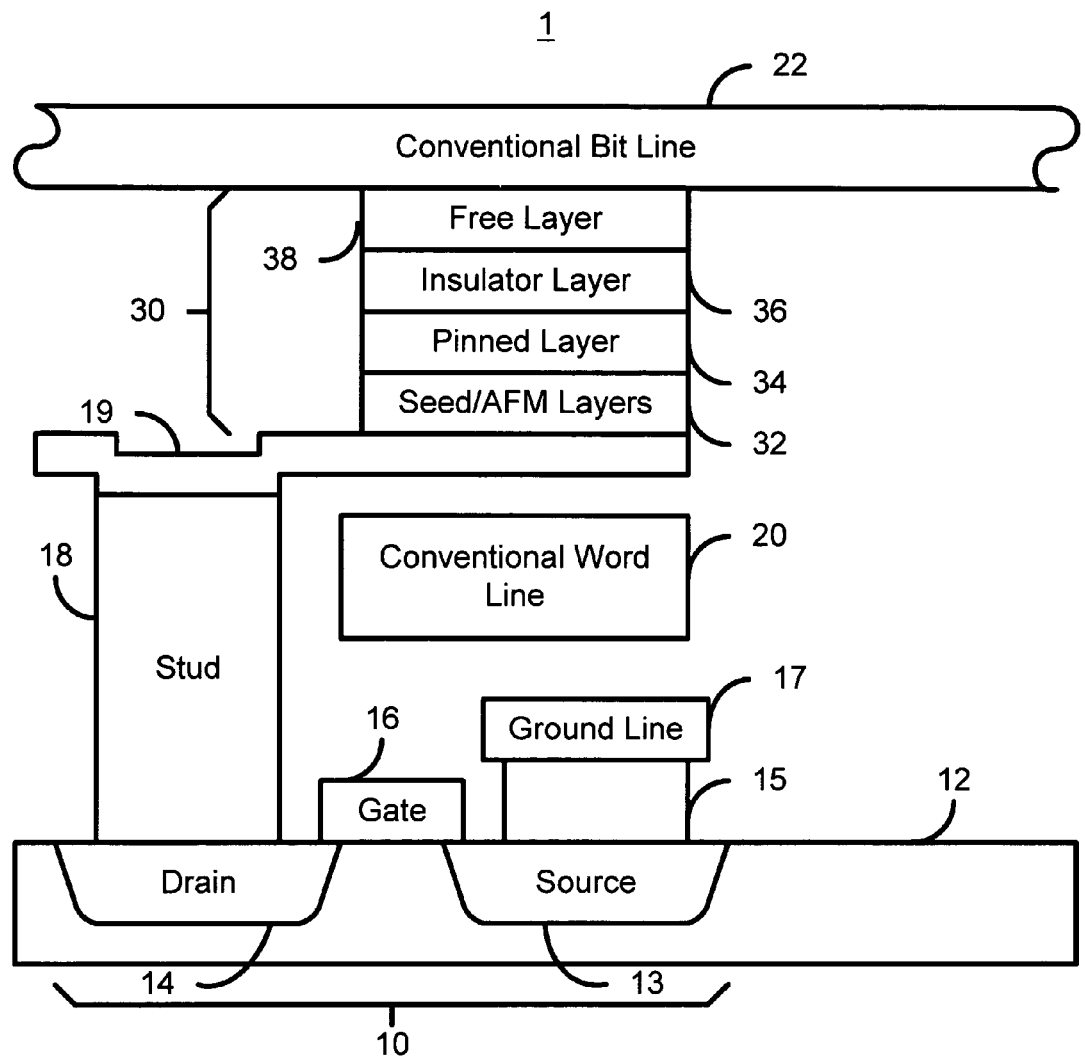
FIG. 1A is a cross-section of a conventional MRAM utilizing MTJ stacks in memory cells, conventional bit lines, and conventional write word lines.
Figure 1B:
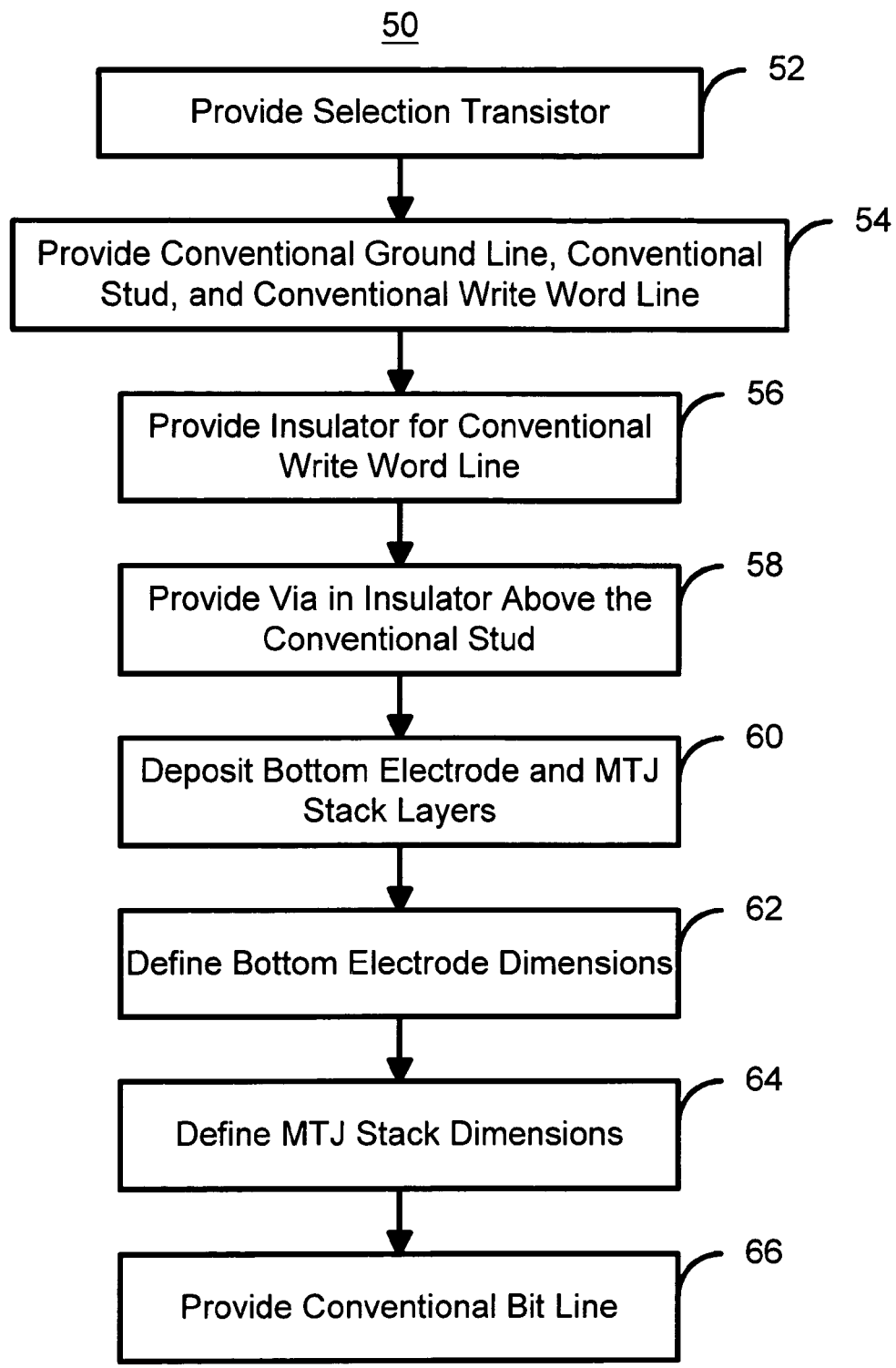
FIG. 1B depicts a high-level flow chart of a conventional method for providing a conventional MRAM.

The MRAM 100 can be programmed and read in an analogous manner to the MRAM 1, depicted in FIG. 1A. Referring back to FIG. 4A, to program the MTJ stack 30', an electrical current, termed a word line write current, is provided through the write word line 112. A magnetic field (not shown) is generated by the word line write current. This magnetic field associated with the word line write current rotates the magnetization of the free layer 38' of the MTJ stack 20' away from the easy axis direction, which is preferably substantially perpendicular to the lengthwise direction of the bit line 110. While the word line write current still on, a bit line write current is provided through the bit line 110. The bit line write current generates a second magnetic field. If the second magnetic field produced by the bit line write current is sufficiently large and in a direction that is mostly opposite to the magnetization direction of the free layer 38' of MTJ stack 30', the magnetization of the free layer 38' settles in a new direction after the fields generated by the word line write current and bit line write current are removed. If the field produced by the bit line current is not sufficiently large and not mostly opposite to the magnetization direction of the free layer 38', then the magnetization of the free layer 38' settles in the original direction after the word line current and bit line current are removed. Thus, the data programming sequence is completed. It should be noted that the isolation transistor 113 is preferably turned off during the data programming sequence described above. Turning the isolation transistor 113 off helps to protect the MTJ stack 30' from being damaged by the bit line current.

To read the data stored in the MTJ stack 30', a read current is driven through the MTJ stack 30'. The isolation transistors 13 is turned on during reading to allow a small, read current to flow from the bit line 110 through the MTJ stack 30' and to the ground line 107. Note that the read current also flows through the thin film conductor 120 (between the MTJ stack and the conductive stud 108), the conductive stud 108, and the isolation transistor 113. While the read current flows through the MTJ stack 30', the voltage drop across the MTJ stack 30' is compared with a reference device. This comparison allows the state of the MTJ stack 30' to be determined. In particular, it can be determined whether the MTJ stack 30' is in a high resistance state (magnetic vector of the free layer 38' substantially antiparallel to the magnetic vector of the pinned layer 34') or in a low resistance state (magnetic vector of the free layer 38' substantially parallel to the magnetic vector of the pinned layer 34'). The high resistance state might be used to represent a one (1), while the low resistance state might be used to represent a zero (0).

Because the bit line 110 is below the MTJ stack 30', while the thin film conductor 120 is above the MTJ stack 30', the topography underlying the MTJ stack 30' is relatively simple. Thus, the surface on which the MTJ stack 30' is formed is relatively flat. Consequently, the MTJ stack 30' can be fabricated with consistency and repeatability. The magnetic properties of the MRAM 100 thus have less variation in magnetic performance between magnetic memory cells. Consequently, performance of the MRAM 100 is improved.

Figure 4B:
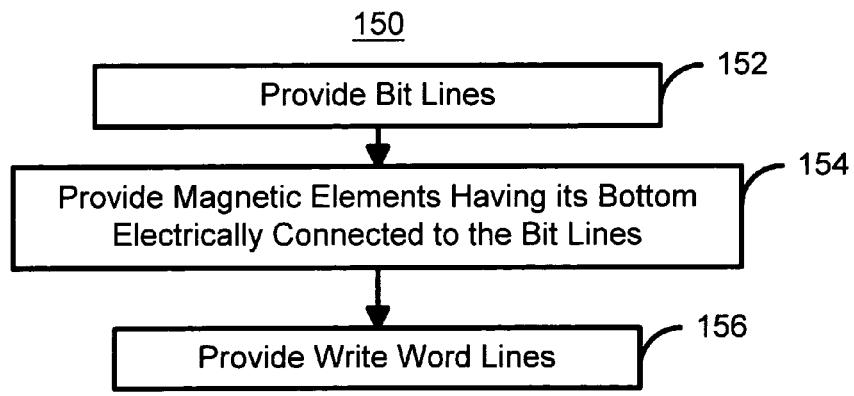
FIG. 4B is a high-level flow chart depicting one embodiment of a method in accordance with the present invention for providing an MRAM architecture including bit lines that resides below the magnetic elements.

FIG. 4B is a high-level flow chart depicting one embodiment of a method 150 in accordance with the present invention for providing an MRAM architecture including bit lines that resides below the magnetic elements. For clarity, the method 150 is described in the context of the MRAM 100. The bit line 110 is provided, via step 152. The MTJ stack 30' is provided, via step 154. The bit line 110 and MTJ stack 30' are provided in steps 152 and 154 such that the bit line 110 is electrically connected to the bottom of the MTJ stack 30'. The write word line 112 is provided such that it is electrically insulated from the MTJ stack 30', via step 156. Thus, the components of the MRAM 100 can be provided.

Figure 4C:
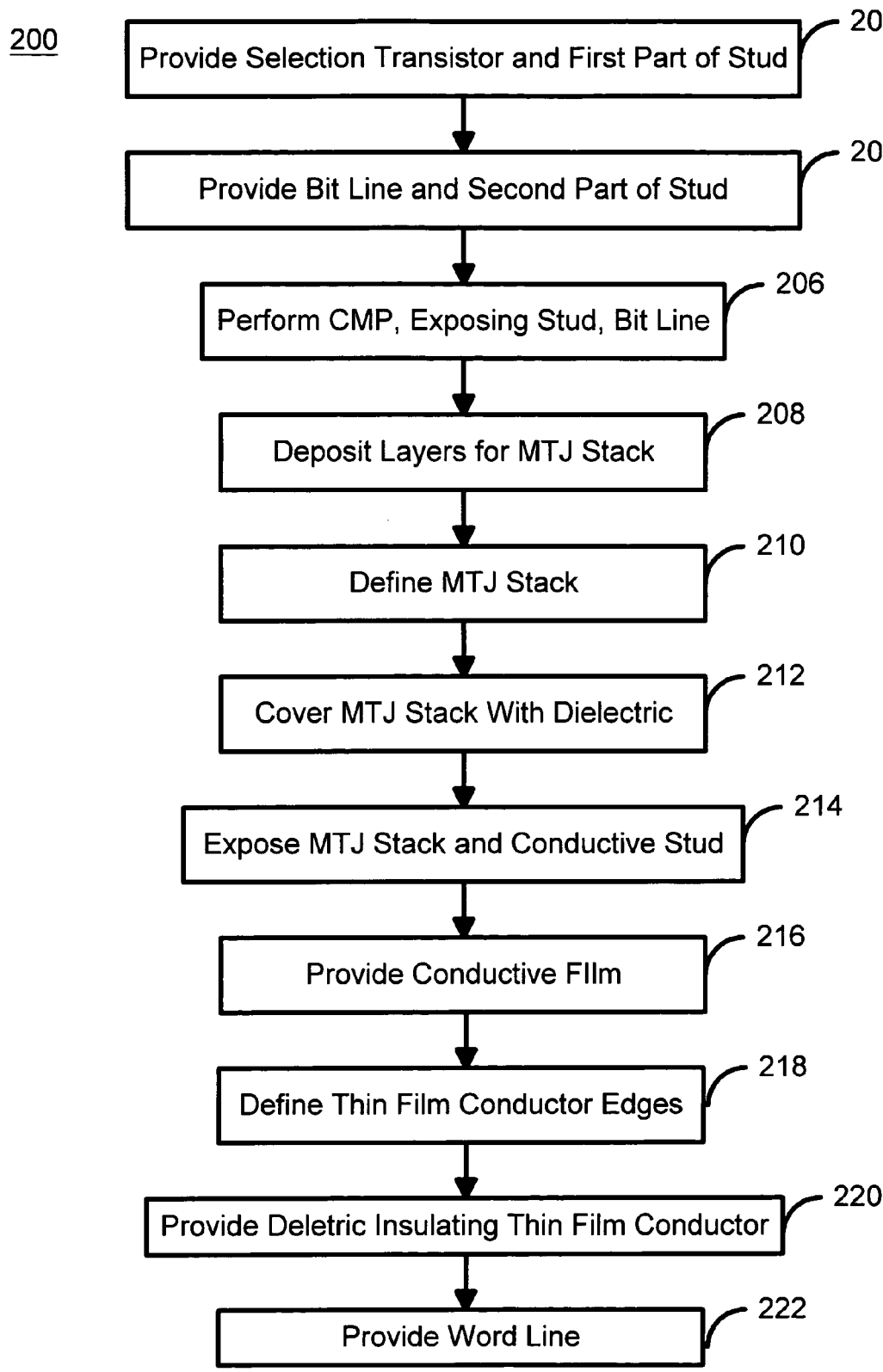
FIG. 4C is a more detailed flow chart depicting one embodiment of a method in accordance with the present invention for providing an MRAM architecture including bit lines that resides below the magnetic elements.

FIG. 4C is a more-detailed flow chart depicting one embodiment of a method 200 in accordance with the present invention for providing an MRAM architecture including bit lines that resides below the magnetic elements. For clarity, the method 200 is described in the context of the MRAM 100. The isolation transistor 113 and the first section 114 of the conductive stud 108 are fabricated on a CMOS wafer with conventional CMOS process, via step 202. The bit line 110 and second portion 116 of the conductive stud 108 are fabricated, via step 204. Step 204 can be performed using either a 'subtractive' process or an 'additive' process. In one embodiment, when the subtractive process is used, a layer of metallic film is deposited first. Photolithography and etching processes then follow to define the second portion 116 of the conductive stud 108 and the bit line 110. A dielectric layer is then deposited to cover the conductive stud 108 and the bit line 110. If the additive process is used in step 204, a dielectric layer is provided and vias and trenches etched into the dielectric layer. The shape and location of the vias and trenches define the shapes and locations of the second portion 116 of the conductive stud 108 and the bit line 110, respectively. An electroplating process is then used to form the second portion 116 of the conductive stud 108 and the bit line 10 in vias and trenches that have been etched into the dielectric layer.

A CMP process is carried out, via step 206. If the subtractive process is used in step 204, the CMP process performed in step 206 removes a portion of the dielectric, exposes the top portion 116 of the conductive stud 108 and the bit line 110. If the additive process is used, then the CMP process removes any excess metallic material outside of the vias and trenches. In either case, the CMP process performed in step 206 provides a flat surface upon which the MTJ stack 30' is to be formed.

The films for the MTJ stack 30' are provided, via step 208. To obtain the films, the wafer containing the MRAM 100 is preferably sent to a physical vapor deposition (PVD) machine for a full wafer deposition of the films for the MTJ stack 30'. A photolithography and etching process is performed to define the MTJ stack 30', via step 210. After the MTJ stack 30 is defined, a layer of dielectric material is provided on the MRAM 100, via step 212. A photolithography process and an etching process are performed to expose the top surface of MTJ stack 30' and the top portion 116 of the conductive stud 108, via step 214. A deposition process is performed to deposit a thin conductive, preferably metallic, film from which the thin film conductor 120 is defined, via step 216. The thin film conductor 120 is defined using photolithography and etching processes, via step 218. A thin dielectric layer 118 is deposited, preferably across the entire wafer on which the MRAM is formed, via step 220. The thin dielectric layer 118 serves as an insulating layer between the thin film conductor 120 and the write word line 112. The write word line 112 is formed, via step 222. Step 222, forming the write word line 112, can be performed using either a subtractive process or an additive process, in an analogous manner to the processes that can be used in forming the bit line 110.

Using the method 200, the photolithography process for defining the MTJ stack 30' is carried out on a flat film surface. In other words, because the topography underlying the MTJ stack 30' is relatively simple, the surface on which the MTJ stack 30' is formed is relatively flat. Consequently, deformation of MTJ stack 30' caused by topography dependence of the photolithography process can be reduced or avoided. The MTJ stack 30' can be thus fabricated consistency and repeatability. The magnetic properties of the MRAM 100 have, therefore, less variation in magnetic performance between magnetic memory cells. Consequently, performance of the MRAM 100 is improved.

Figure 5A:
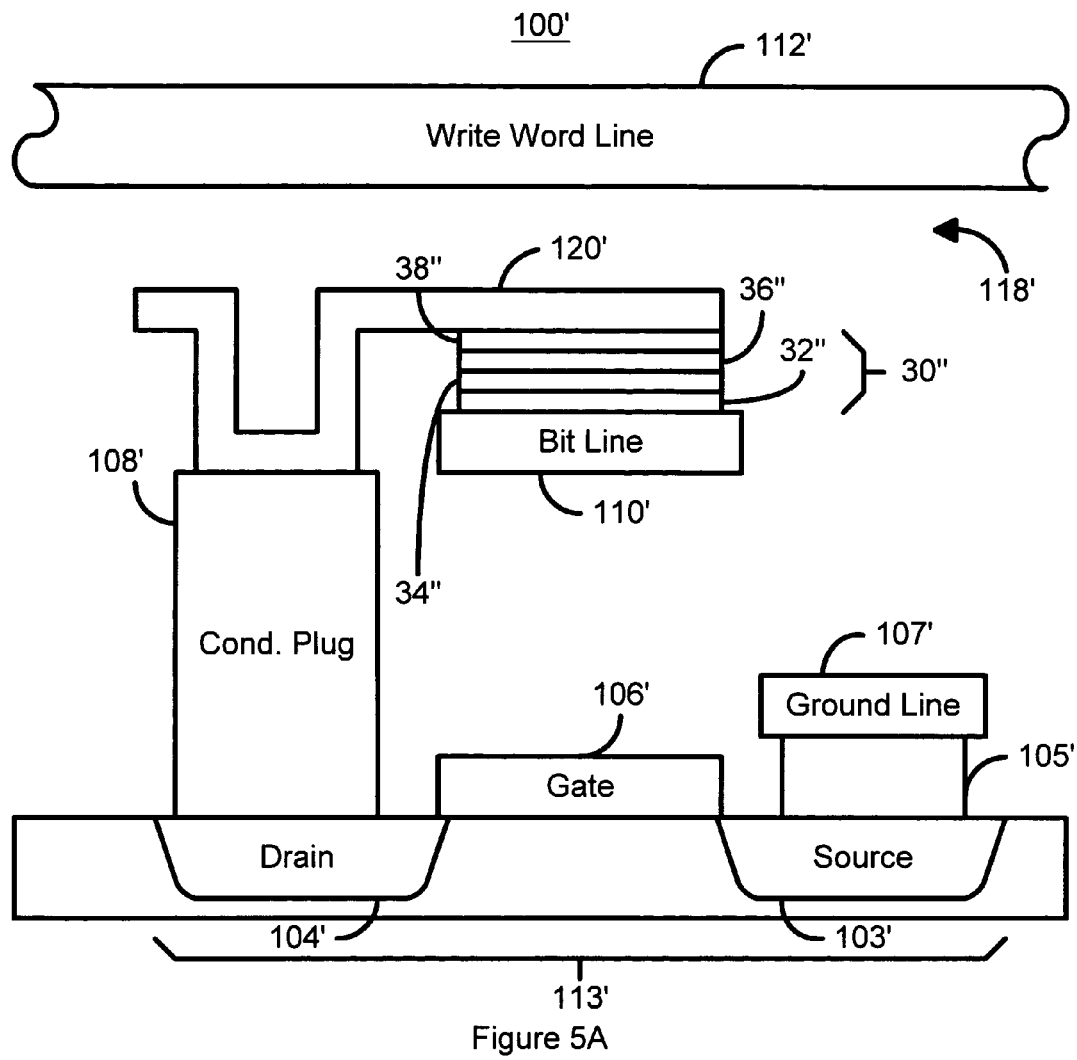
FIG. 5A depicts a second embodiment of an MRAM architecture in accordance with the present invention including bit lines that resides below the magnetic elements.

FIG. 5A depicts a second embodiment of an MRAM architecture 100' in accordance with the present invention including bit lines that resides below the magnetic elements. For clarity, only a single magnetic element, a single bit line, and a single write word line are shown. However, one of ordinary skill in the art will readily recognize that the MRAM 100' includes a number of magnetic elements, bit lines, and word lines. In addition, portions of the MRAM 100' are analogous to the MRAM 100 depicted in FIG. 4A. Thus, portions of the MRAM 100' are labeled similarly to the MRAM 100.

Referring back to FIG. 5A, the structure and fabrication of the bit line 110' and conductive stud 108' differ from that depicted in the MRAM 100 and method 200. The conductive stud 108' includes a single portion. In addition, the bit line 110' is below the MTJ stack 30", while the thin film conductor 120' is above the MTJ stack 30". As a result, the topography underlying the MTJ stack 30" is relatively simple. Thus, the surface on which the MTJ stack 30" is formed is relatively flat. Consequently, the MTJ stack 30" can be fabricated with consistency and repeatability. The magnetic properties of the MRAM 100' thus have less variation in magnetic performance between magnetic memory cells. Consequently, performance of the MRAM 100' is improved.

Figure 5B:
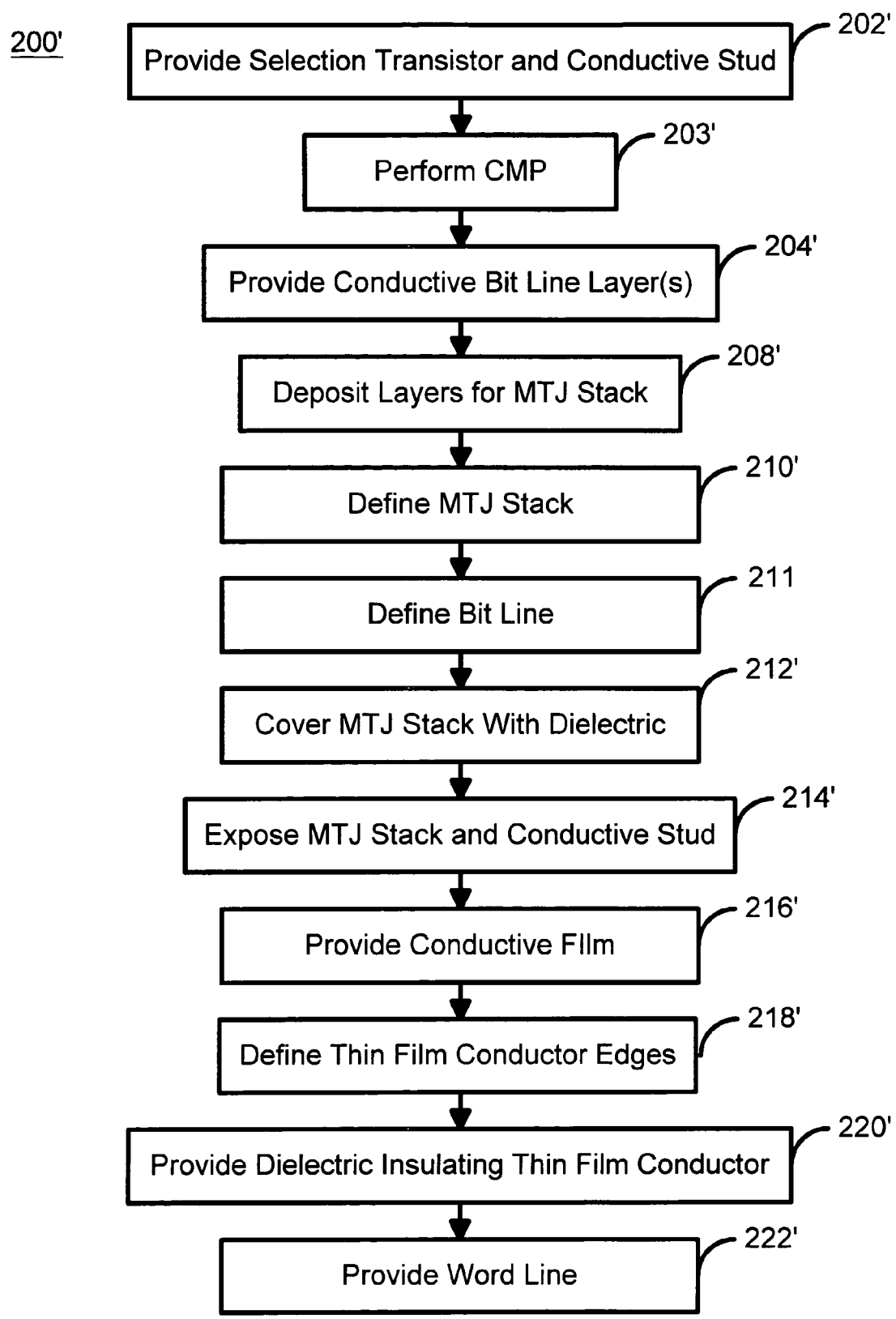
FIG. 5B is a high-level flow chart depicting a second embodiment of a method in accordance with the present invention for providing an MRAM architecture including bit lines that resides below the magnetic elements.

FIG. 5B is a high-level flow chart depicting a second embodiment of a method 200' in accordance with the present invention for providing an MRAM architecture including bit lines that resides below the magnetic elements. For clarity, the method 200' is described in the context of the MRAM 100'. The isolation transistor 113' and the entire conductive stud 108' are fabricated on a CMOS wafer with conventional CMOS process, via step 202'. Thus, the bit line 110' is not fabricated at the same time as a portion of the conductive stud 108'. Instead, the bit line 110 is implemented with a metallic thin film that is deposited in the same deposition sequence as the MTJ stack 30" after the isolation transistor 113 and conductive stud 108' are fabricated in step 202'. Thus, a CMP process is carried out after the isolation transistor 113' and conductive stud 108' are formed an insulated, via step 203'. Thus, prior to deposition of the films forming the MTJ stack 30" a smooth surface is obtained in step 203'.

At least one conductive, preferably metallic layer, which is to be turned into bit line 110 is provided, via step 204'. The layers for the MTJ stack 30" are provided, via step 208'. Photolithography and etching processes are performed to define the dimensions of MTJ stack 30", via step 210'. The geometry of bit line 110 is then defined by additional photolithography and etching processes, via step 211. The remainder of the steps are analogous to those described in conjunction with the method 200 depicted in FIG. 4C.

Thus, referring back to FIG. 5B, a layer of dielectric material is provided on the MRAM 100, via step 212'. Consequently, the bit line 110' and the MTJ stack 30" are insulated in step 202'. Photolithography and etching processes are performed to expose the top surface of MTJ stack 30" and the conductive stud 108', via step 214'. A deposition process is performed to deposit a thin metallic film from which the thin film conductor 120' is defined, via step 216'. The thin film conductor 120' is defined using photolithography and etching processes, via step 218'. The thin dielectric layer 118' is deposited, preferably across the entire wafer on which the MRAM is formed, via step 220'. The write word line 112 is formed, via step 222'. Step 222 can be performed using either a subtractive process or an additive process, in an analogous manner to the processes described above.

Using the method 200', the topography underlying the MTJ stack 30" is relatively simple, the surface on which the MTJ stack 30" is formed is relatively flat. Consequently, deformation of MTJ stack 30" caused by topography dependence of the photolithography process can be reduced or avoided. The MTJ stack 30" can be thus fabricated consistency and repeatability. The magnetic properties of the MRAM 100' have, therefore, less variation in magnetic performance between magnetic memory cells. Consequently, performance of the MRAM 100' is improved.

Figure 6:
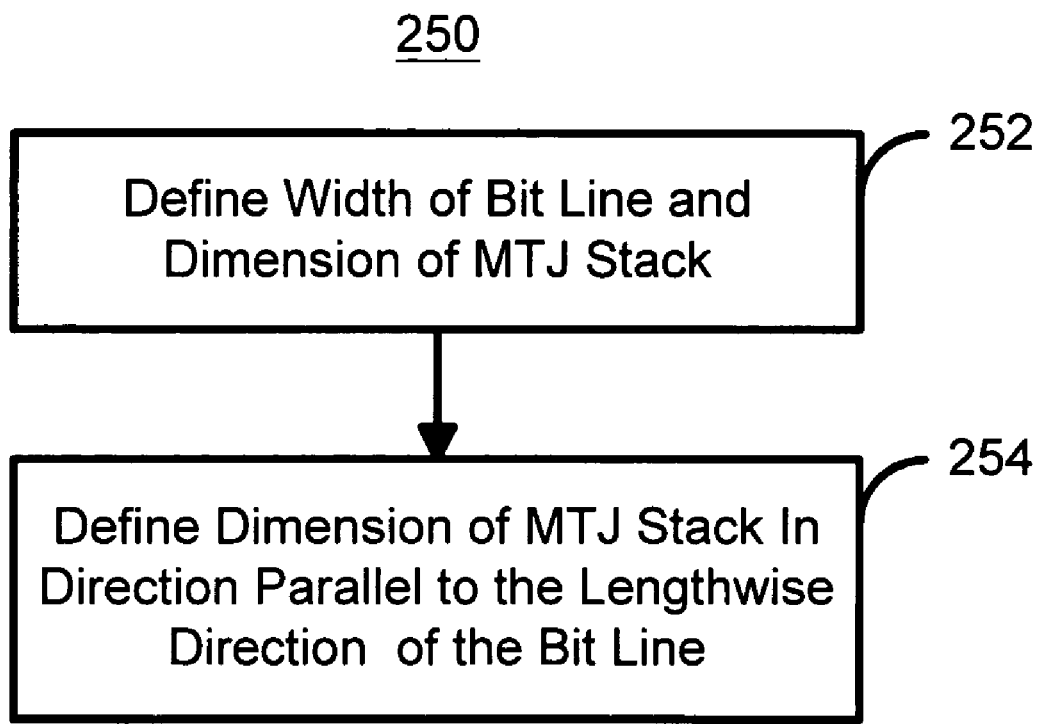
FIG. 6 is a high-level flow chart depicting a third embodiment of a method in accordance with the present invention for forming the magnetic element and bit line in accordance with the present invention.

In some embodiments, a rectangular or square shape may be desired for the MTJ stack 30 or 30'. FIG. 6 is a high-level flow chart depicting a third embodiment of a method 250 in accordance with the present invention for forming the magnetic element and bit line in accordance with the present invention. The method 250 is preferably used when a square or rectangular shape are desired for the MTJ stack 30 or 30'. Thus, the method 250 is described in conjunction with the MRAMs 100 and 100' in FIGS. 4A and 5A. The method 250 can be used in lieu of the steps 210 or 210', which define the geometry of the MTJ stack 30' or 30". Thus, the method 250 preferably commences after the deposition of the bit line 10 and MTJ 11 layers in steps 204 and 208 or steps 204' and 208'.

Photolithography and etching processes are performed to define the width of bit line 110 or 110' and the dimension of MTJ stack 30' or 30", respectively, in the same direction, via step 252. Thus, step 252 defines the width of the bit line 110 or 110' and the MTJ stack 30' or 30" in the horizontal direction as depicted in FIGS. 4A and 5A. Another set of photolithography and etching processes is performed to define the dimension of the MTJ stack 30' or 30" in the direction along the long axis of bit line 110 or 110', respectively, via step 254. Thus, step 254 defines the dimension of the MTJ stack 30' or 30" perpendicular to the page, as depicted in FIGS. 5A and 5A. By using the method 250, alignment between bit line 110 or 110' and the MTJ stack 30' or 30" as well as the desired shape of the MTJ stack 30' or 30" can be achieved.

Note that the method 250 is described in terms of the steps 252 and 254 being performed in a particular order. However, one of ordinary skill in the art will readily recognize that the above sequence might be reversed. In such an embodiment, steps 254 of defining the dimension of the MTJ stack 30' or 30" in the direction along the symmetrical axis of bit line 110 or 110', respectively would be performed first. Step 252 of defining the width of bit line 110 or 110' and the dimension of the MTJ stack 30' or 30", respectively, in the same direction would be performed second. Such a sequence also allows for alignment between bit line 110 or 110' and MTJ stack 30' or 30", respectively, as well as the desired shape of the MTJ stack 30' or 30".

Thus, using the methods 200, 200' and/or 250, MRAMs 100 and 100' having improved process control can be provided. In addition, the methods 200, 200' and/or 250, MRAMs 100 and 100' allow for increased processing flexibility. Furthermore, as described above, the variation in magnetic properties of the MRAMs 100 and 100' can be decreased and performance of the MRAMs 100 and 100' improved.

Figure 7:
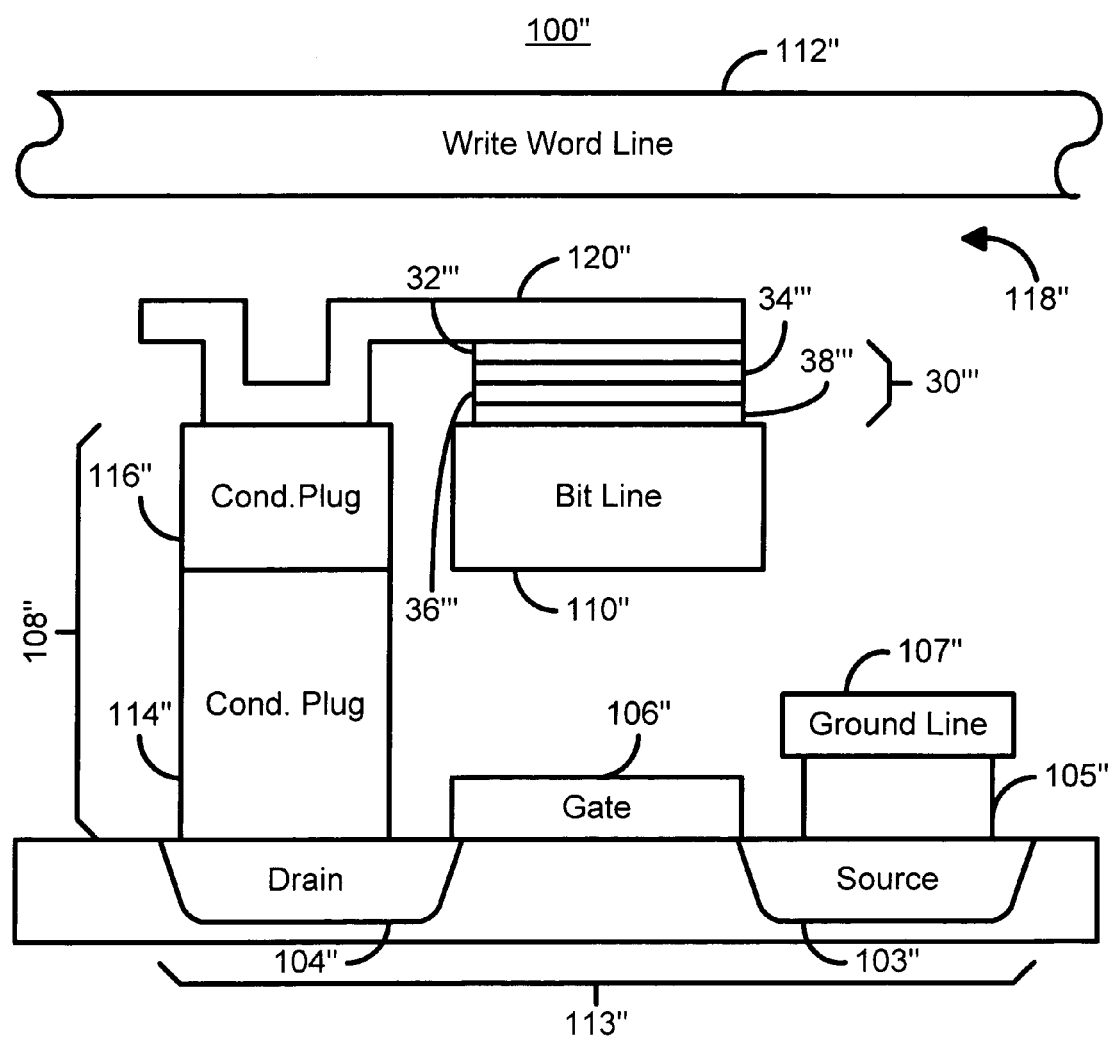
FIG. 7 depicts another embodiment of an MRAM architecture in accordance with the present invention including bit lines that resides below the magnetic elements.
Figure 8:
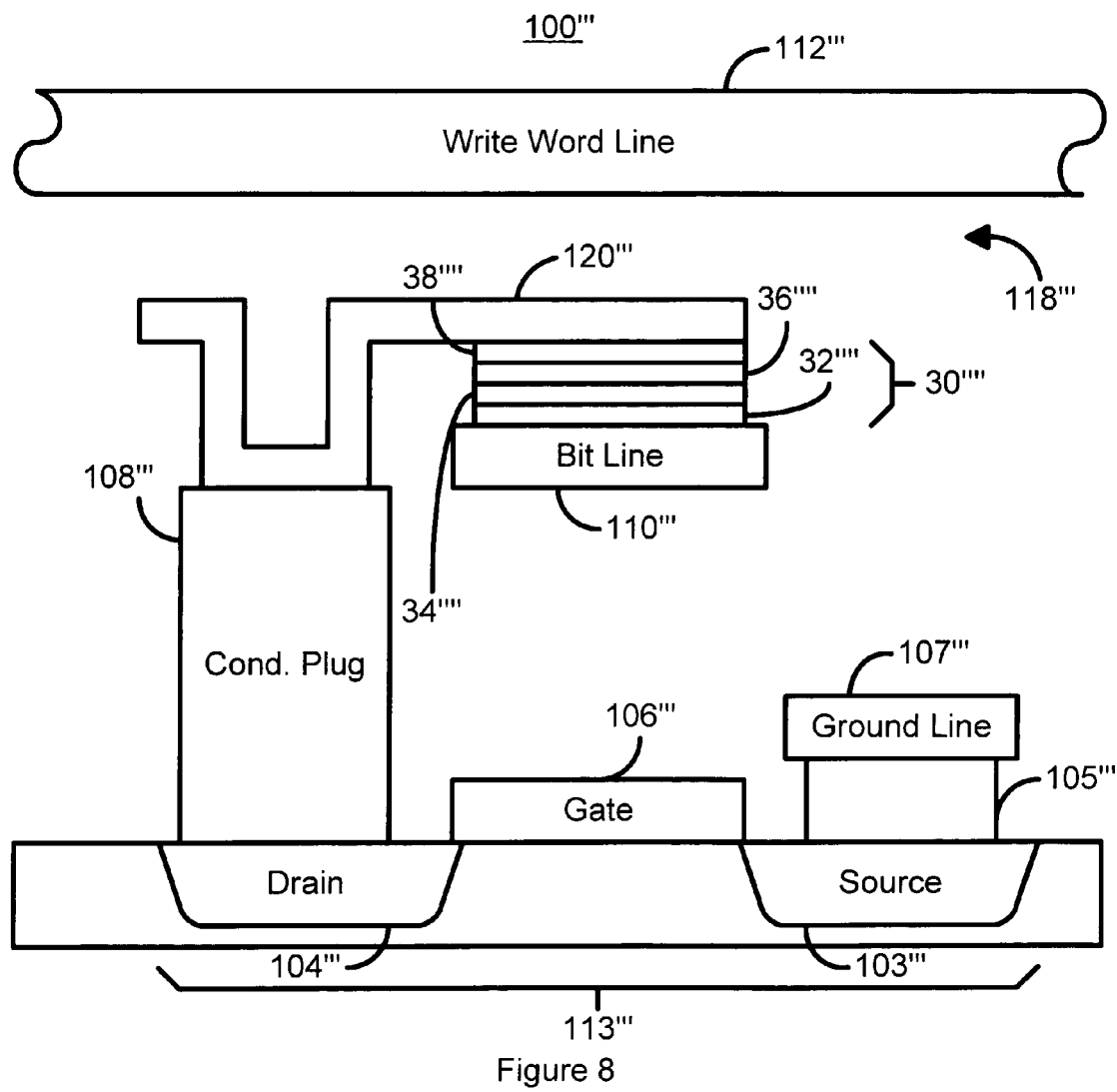
FIG. 8 depicts another embodiment of an MRAM architecture in accordance with the present invention including bit lines that resides below the magnetic elements.
Figure 9:
FIG. 9 depicts an embodiment of a magnetic write line usable in an MRAM architecture in accordance with the present invention including bit lines that resides below the magnetic elements.
Figure 10:
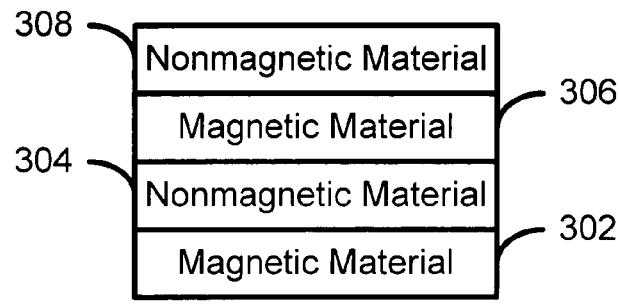
FIG. 10 depicts an embodiment of a magnetic write line usable in an MRAM architecture in accordance with the present invention including bit lines that resides below the magnetic elements.
Figure 11:
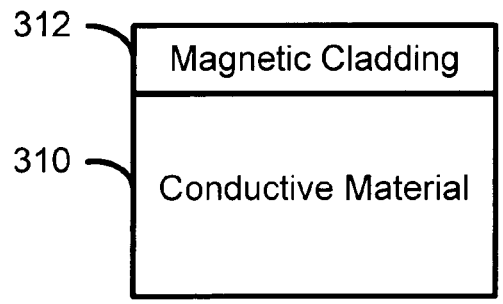
FIG. 11 depicts an embodiment of a magnetic write line usable in an MRAM architecture in accordance with the present invention including bit lines that resides below the magnetic elements.
Figure 12:
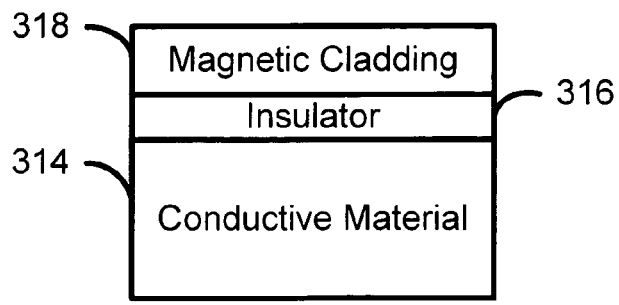
FIG. 12 depicts an embodiment of a magnetic write line usable in an MRAM architecture in accordance with the present invention including bit lines that resides below the magnetic elements.

Furthermore, FIGS. 7 and 8 depict alternate embodiments 100" and 100'", respectively, of MRAM architecture in accordance with the present including bit lines that resides below the magnetic elements. The MRAM 100" is analogous to the MRAM 100 and has components that are labeled analogously. However, the magnetic element 30'" has its layers reversed from the magnetic element 30' depicted in FIG. 4A. In particular, the free layer 38'" resides below the dielectric layer 36'". The pinned layer 34'" resides on the dielectric layer 36'". In addition, the layers 32'" includes a layer of antiferromagnetic material in contact with the surface of the pinned layer 34'" to fix the direction of the magnetization in the pinned layer 34'". In addition, seed layers (not shown) may be provided under the free layer 38'". Similarly, the MRAM 100'" is analogous to the MRAM 100' and thus has components that are labeled analogously. However, the magnetic element 30"" has its layers reversed from the magnetic element 30" depicted in FIG. 4A. In particular, the free layer 38"" resides below the dielectric layer 36"". The pinned layer 34"" resides on the dielectric layer 36"". In addition, the layers 32"" include a layer of antiferromagnetic material in contact with the surface of the pinned layer 34"" to fix the direction of the magnetization in the pinned layer 34"". In addition, seed layers (not shown) may be provided under the free layer 38"".

FIGS. 9–12 depict embodiments of magnetic lines 300, 300', 300", and 300'" that could be used for one or more of the lines 110 and 112, 110' and 112', 110" and 112", and 110'" and 112'" depicted in FIGS. 4A, 5A, 7, and 8, respectively. The magnetic lines 300, 300', 300", and 300'" are also analogous to the lines 82 and 83, discussed above. The magnetic line 300 is composed substantially or wholly of a soft magnetic material. Thus, a core portion of the line 300, as opposed to only a cladding, includes magnetic material. The magnetic line 300' is a laminate of layers 302, 304, 306 and 308 including magnetic layers 302 and 306 as well as nonmagnetic layers 304 and 308. The magnetic line 300" includes a conductive layer 310 and a magnetic cladding layer 312 that is on a side not facing the MTJ stack 30'". Finally, the magnetic line 300'" includes conductive material 314 and a magnetic cladding layer 318 separated by from the conductive material 314 by a nonmagnetic layer 316.

A method and system has been disclosed for providing a magnetic memory having simpler fabrication, greater process control, and design and process flexibility. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory comprising:
a plurality of magnetic elements, each of the plurality of magnetic elements having a top and a bottom;
at least a first write line connected to the bottom of each of a first portion of the plurality of magnetic elements;
at least a second write line residing above the top of a second portion of the plurality of magnetic elements, the at least the second write line being electrically insulated from each of the second portion of the plurality of magnetic elements, the at least the first write line and/or the at least the second write line being a magnetic write line including a magnetic material in a core portion of the magnetic write line;
a plurality of conductive plugs for electrically coupling to the plurality of magnetic elements, the plurality of conductive plugs configured such that no portion of the plurality of conductive plugs resides directly below the plurality of magnetic elements.

2. The magnetic memory of claim 1 wherein each of the plurality of magnetic elements is a magnetic tunneling junction including a pinned layer, a free layer and an insulating layer between the pinned layer and the free layer.

3. The magnetic memory of claim 2 wherein the free layer resides below the insulating layer.

4. The magnetic memory of claim 2 wherein the free layer resides above the insulating layer.

5. The magnetic memory of claim 4 wherein the pinned layer is part of the at least the first write line.

6. The magnetic memory of claim 1 wherein the magnetic write line further includes a laminated structure including at least one nonmagnetic layer and at least one soft magnetic layer.

7. The magnetic memory of claim 1 wherein the magnetic write line includes at least one nonmagnetic line having at least one surface not facing the first portion of the plurality of magnetic elements, wherein the at least the first write line further includes at least one magnetic cladding layer residing on the at least one surface.

8. The magnetic memory of claim 1 wherein the magnetic write line includes a magnetic cladding layer and an insulator, the magnetic cladding layer being electrically insulated from a remaining portion of the magnetic write line by the insulator.

9. The magnetic memory of claim 1 wherein a material for the at least the first write line is provided and the at least the first write line is defined prior to the deposition of a second material for the plurality of magnetic elements.

10. The magnetic memory of claim 1 wherein a material for the at least the first write line is provided in a same deposition sequence as at least one layer of the plurality of magnetic elements.

11. The magnetic memory of claim 1 wherein the at least the first write line is defined after deposition of at least one layer of the plurality of magnetic elements.

12. The magnetic memory of claim 1 wherein the at least the first write line has a width in a first direction and wherein the plurality of magnetic elements has a dimension in the first direction and wherein the width and the dimension are both defined in a photolithography process.

13. The magnetic memory of claim 1 further comprising:

a plurality of isolation devices for the plurality of magnetic elements; and a plurality of thin film conductors, the plurality of thin film conductors for connecting the plurality of isolation devices with the top of each of the plurality of magnetic elements.

* * * * *